United States Patent
Ma

(10) Patent No.: US 7,556,522 B2
(45) Date of Patent: Jul. 7, 2009

(54) LAND GRID ARRAY CONNECTOR HAVING IMPROVED STIFFENER

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/901,330

(22) Filed: Sep. 17, 2007

(65) Prior Publication Data

US 2008/0070426 A1    Mar. 20, 2008

(51) Int. Cl.
*H01R 4/50* (2006.01)
(52) U.S. Cl. .................................. 439/342
(58) Field of Classification Search ............ 439/342, 439/247, 70–73; 361/769, 760–761
See application file for complete search history.

(56) References Cited

U.S. PATENT DOCUMENTS

| 5,287,617 | A  | * | 2/1994 | Murphy | 29/741 |
| 6,249,440 | B1 | * | 6/2001 | Affolter | 361/769 |
| 6,325,655 | B1 | * | 12/2001 | Noda et al. | 439/342 |
| 7,247,041 | B2 | * | 7/2007 | Ma et al. | 439/247 |
| 2007/0020963 | A1 | | 1/2007 | Hao-Yun Ma et al. | |

* cited by examiner

*Primary Examiner*—Jean F Duverne
(74) *Attorney, Agent, or Firm*—Wei Te Chung

(57) ABSTRACT

A LGA connector (100) adapted for being mounted to a printed circuit board, includes a housing (30), a number of contacts mounted in the housing, a stiffener (50) coupled with the housing and defining a number of non-circular mounting holes (502), a lever (70) and a cover (60) respectively mounted on the stiffener, and a number of standoffs (90) inserted into the mounting holes of the stiffener. Each mounting hole has a long diameter and a short diameter. Each standoff defines a pinhole (910) for permitting a screw including a screw cap having a diameter larger than the short diameter of the mounting hole to insert through the pinhole.

12 Claims, 4 Drawing Sheets

LAND GRID ARRAY CONNECTOR HAVING IMPROVED STIFFENER

FIELD OF THE INVENTION

The present invention relates to an electrical connector, and particularly to a land grid array (LGA) connector for electrically connecting an electronic package such as an IC package and a circuit substrate such as a printed circuit board (PCB).

DESCRIPTION OF RELATED ART

A land grid array connector electrically connecting an IC package to a PCB is described in U.S. Patent Publication No. 2007/0020963, which was published on Jan. 25, 2007. The connector comprises a stiffener having a front wall and a rear wall, a housing received within the stiffener for supporting the IC package, a plurality of contacts retained within the housing, a cover and a lever respectively rotatably mounted on the rear wall and the front wall of the stiffener. The stiffener has a plurality of circular mounting holes defined at four corner portions thereof. A plurality of screws insert throughout the circular mounting holes for fixing the connector onto the PCB.

Only the screw whose screw cap has the diameter larger than that of the circular mounting hole could be applied in the connector. The type of available screws is thereby limited.

Hence, an improved land grid array connector is required to overcome the above-mentioned disadvantages of the related art.

SUMMARY OF THE INVENTION

An object of the present invention is to provide a land grid array connector, wherein more types of screws could be applied to mount the connector to a PCB.

To achieve the aforementioned objects, a LGA connector adapted for being mounted to a PCB comprises a housing defining a plurality of slots, a plurality of contacts mounted in the slots of the housing, a stiffener coupled with the housing and defining a first window surrounding the housing and a plurality of non-circular mounting holes, a lever and a cover respectively mounted at a front and a rear portion of the stiffener, and a plurality of standoffs inserted into the mounting holes of the stiffener. Each mounting hole has a long diameter and a short diameter. Each standoff defines a pinhole for permitting a screw having a screw cap having a diameter larger than the short diameter of the mounting hole to insert through the pinhole.

In the conventional art, only the screws whose screw cap having a diameter larger than the conventional circular mounting hole could be used. In this application, the mounting hole is designed non-circular and has a short diameter shorter than the long diameter, which is equal to that of the conventional circular mounting hole. Therefore, the screws whose screw cap has the diameter larger than the short diameter, but not the long diameter, could be applied in this application. The type of screws adapted for being used is increased.

Other objects, advantages and novel features of the invention will become more apparent from the following detailed description of a preferred embodiment when taken in conjunction with the accompanying drawings.

DETAILED DESCRIPTION OF THE INVENTION

Figure 1:
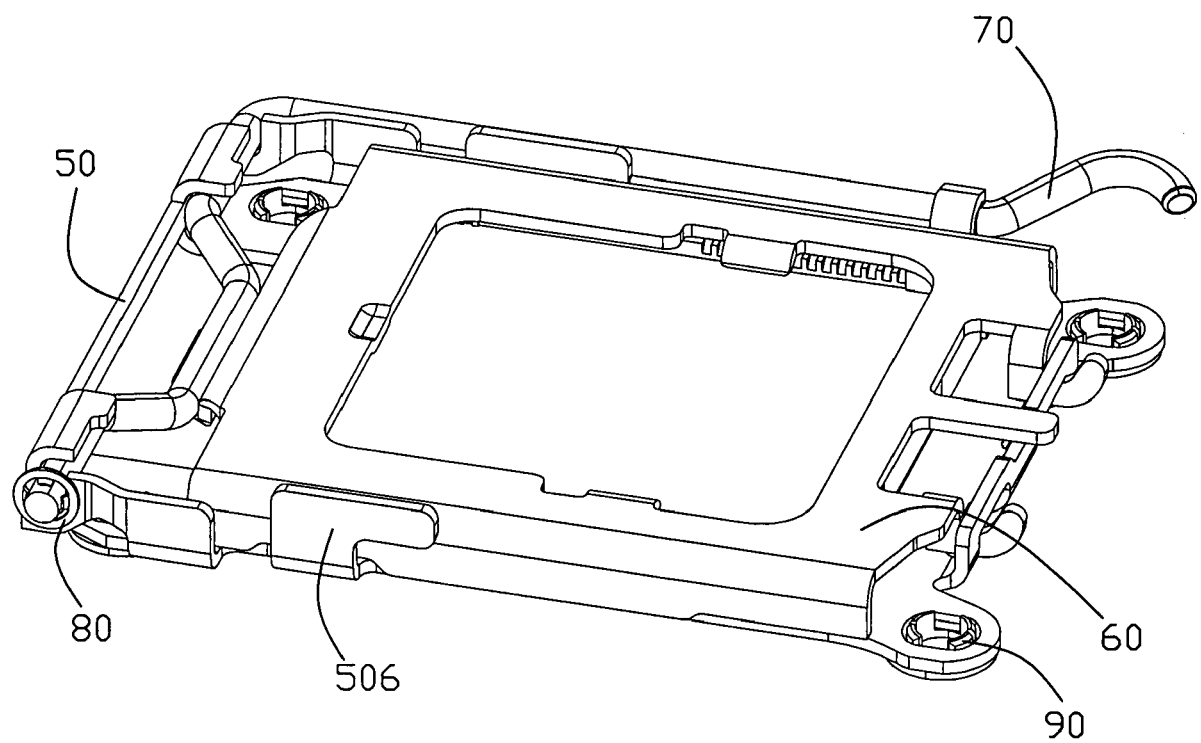
FIG. 1 is an assembled perspective view of a LGA connector in accordance with the present invention.

Reference will now be made to the drawing figures to describe the present invention in detail. Referring to FIGS. 1-4, a LGA connector 100 in accordance with the preferred embodiment of the present invention is adapted for electrically connecting an IC package (not shown) and a PCB (not shown). The LGA connector 100 comprises a housing 30, a plurality of contacts (not shown) inserted within the housing 30, a stiffener 50 defining a first window 503 for surrounding the housing 30, a cover 60 and a lever 70 respectively rotatably mounted on the stiffener 50, a ring 80, and a plurality of standoffs 90 mounted on the stiffener 50. The LGA connector 100 is mounted onto the PCB via a plurality of screws (not shown).

Figure 2:
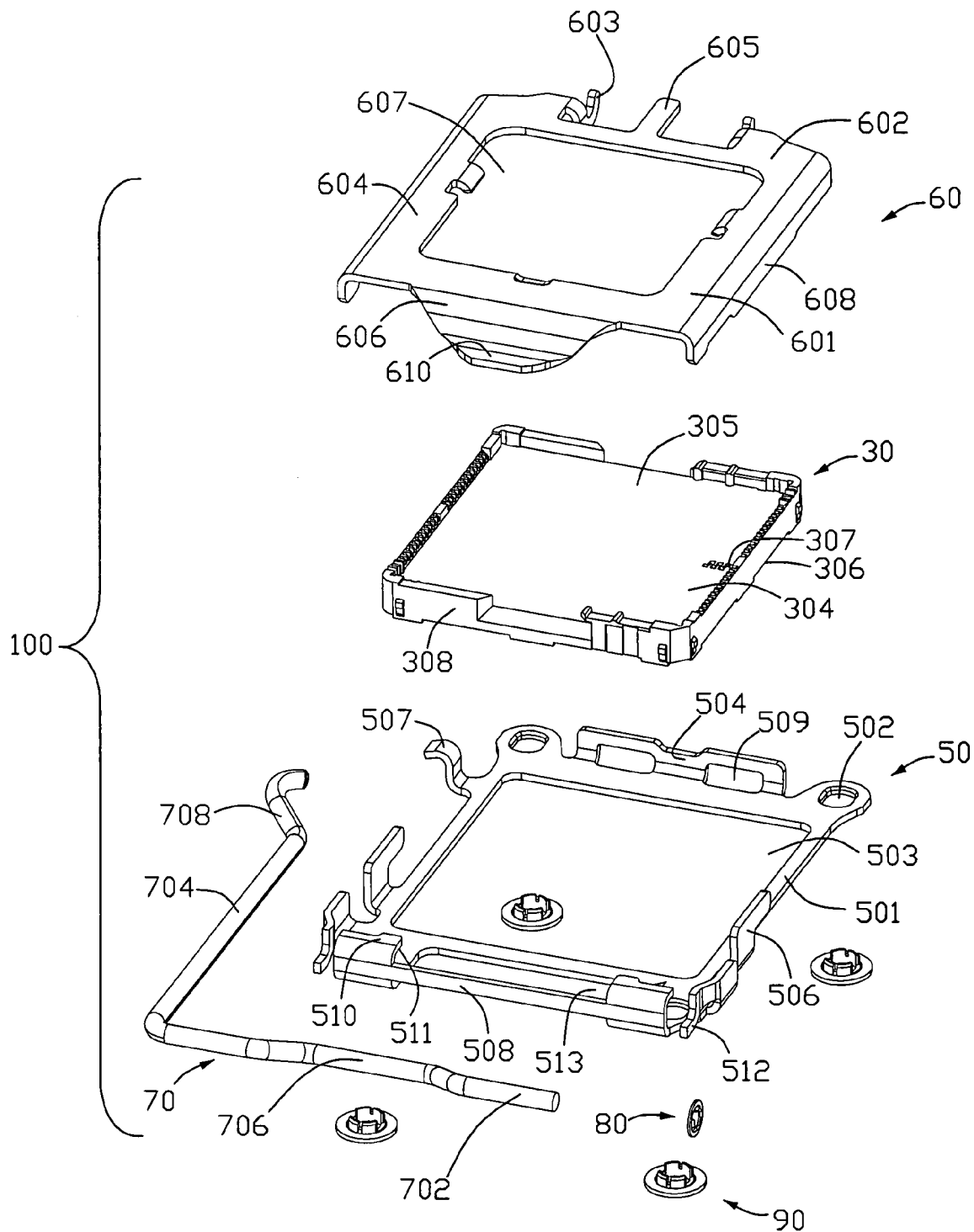
FIG. 2 is an exploded perspective view of the LGA connector as shown in FIG. 1.
Figure 3:
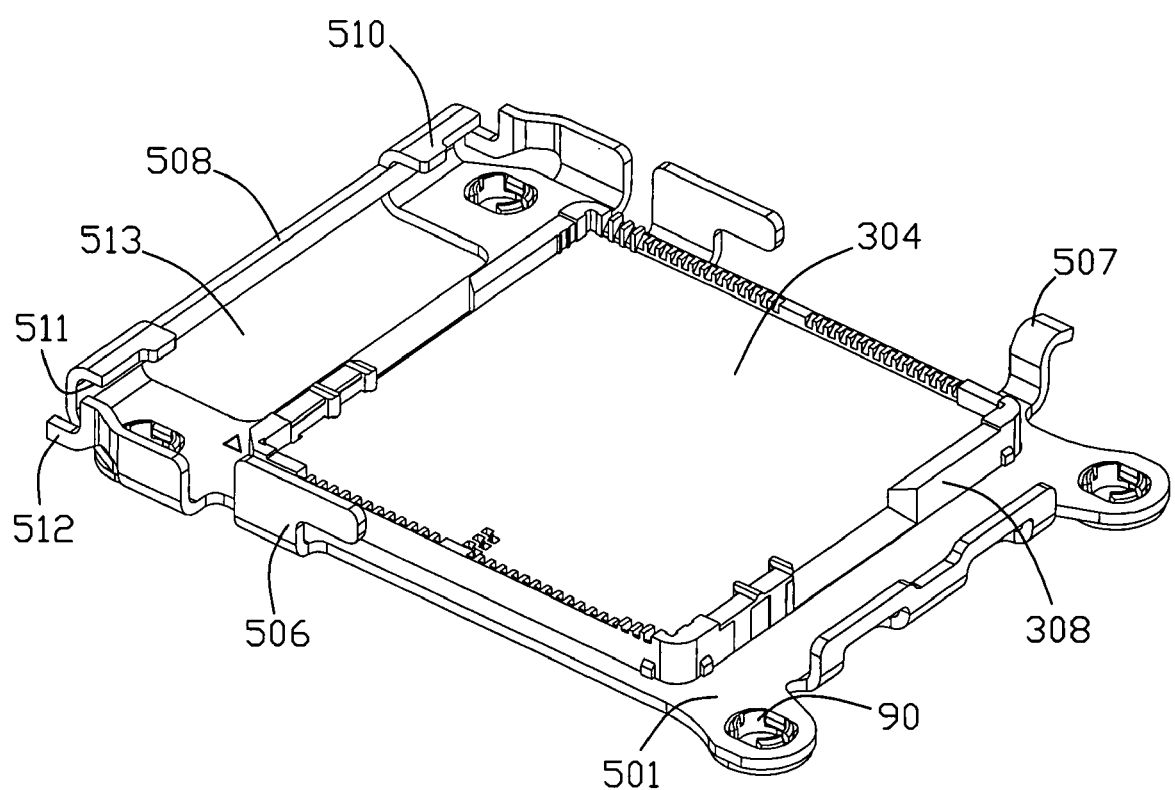
FIG. 3 is a partially assembled perspective view of the LGA connector as shown in FIG. 1, with the lever and the cover being removed.

Referring to FIG. 2, the housing 30 is of a rectangular configuration and comprises a conductive region 304 having a supporting wall 305, a mounting wall 306 opposite to the supporting wall 305 for being mounted on the PCB, a plurality of periphery walls 308 surrounding the conductive region 304, and a plurality of slots 307 defined in the conductive region 304 for receiving the contacts.

The stiffener 50 comprises a primary portion 501, a rectangular first window 503 defined in a center of the primary portion 501, a plurality of non-circular mounting holes 502 defined at four corner portions of the primary portion 501, a depression 513 defined at a front portion of the primary portion 501, a front wall 508 and a rear wall 504 respectively upstanding from front and rear edges of the primary portion 501. A pair of opposite side edges of the primary portion 501 has a pair of blocking portions 506 upstanding from front portions thereof, and a pair of supporting portions 512 extending forwardly from front ends thereof. One side edge of the primary portion 501 has a latch 507 extending outwardly from a rear portion thereof. The front wall 508 has a pair of substantially L-shaped engaging portions 510 each defining an engaging slot 511. The rear wall 504 has a pair of engaging holes 509 defined thereon.

Figure 4:
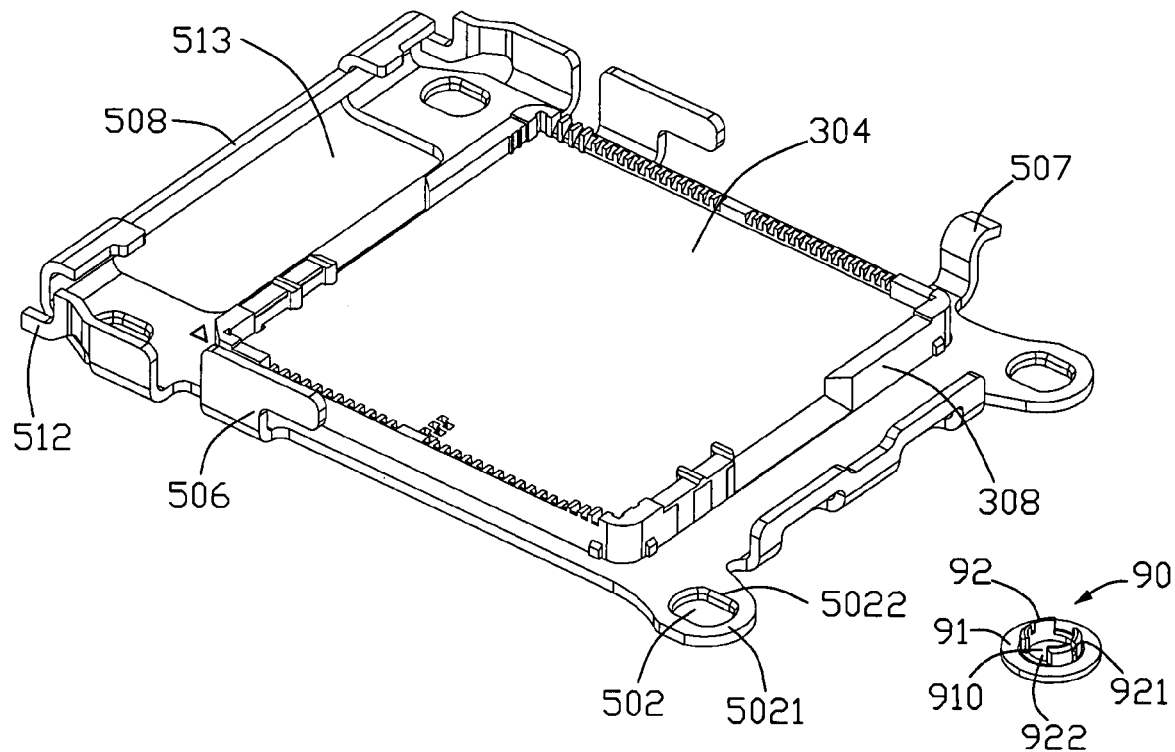
FIG. 4 is a partially assembled perspective view similar to FIG. 3, with a standoff being removed.

In conjunction with FIG. 4, in this embodiment, the mounting hole 502 is shaped by interconnecting a pair of symmetrical arc-like edges 5021 and a pair of opposite parallel edges 5022. Such a mounting hole 502 has a long diameter between the two arc-like edges 5021, and a short diameter between the two parallel edges 5022 shorter than the long diameter. Optionally, the mounting hole 502 could be punched into ellipse or other shapes, if only having two different diameters.

The cover 60 comprises a primary plate 601 having a second window 607 defined therein, a pivotal portion 602, a tongue portion 606 opposite to the pivotal portion 602, and a pair of side portions 604 surrounding the second window 607. The pivotal portion 602 has a pair of hooks 603 projecting rearwardly therefrom and a rearwardly extending tail portion 605 formed between the pair of hooks 603. The tongue portion 606 is provided with a depressing portion 610 inclining downwardly and then tilting upwardly and adapted for being depressed by the lever 70. Each side portion 604 has a side wall 608 extending downwardly therefrom.

The lever 70 comprises a shaft 702 and an actuator 704 perpendicular to the shaft 702 to thereby form the lever as a L-shape. The shaft 702 has an U-shaped bending portion 706 bending inwardly from a middle portion thereof. The actuator 704 is provided with a handle 708 at a free end thereof.

Referring to FIG. 4, each standoff 90 comprises a circular base portion 91 defining a pinhole 910, a plurality of teeth 921 extending upwardly from the base portion 91. The standoff 90 is punched by leaving out some teeth along the diameter direction of the pinhole 910, to thereby form a pair of indentations 922 symmetrically defined between adjacent teeth 921.

Referring to FIGS. 1-4, in assembly of the LGA connector 100, the plurality of contacts are pre-loaded within the housing 30. The housing 30 together with the contacts is then mounted within the first window 503 of the stiffener 50. The cover 60 and the lever 70 are respectively assembled to the rear wall 504 and the front wall 508 of the stiffener 50. The hooks 603 of cover 60 are inserted in the engaging holes 509 to make the cover 60 pivotable around the rear wall 504. The tail portion 605 is disposed above the rear wall 504 for preventing an excessive rotation of the cover 60.

The shaft 702 of the lever 70 is inserted in the engaging slots 511 and is upheld by the supporting portions 512, with the bending portion 706 depressing the depressing portion 610 of the cover 60. The ring 80 is assembled to a free end of the shaft 702 of the lever 70 and resists against one supporting portion 512. The insertion portions 92 of the standoffs 90 are inserted in the mounting holes 502 in a bottom-to-top direction. The teeth 921 of the standoff 90 couple with the arc-like edges 5021. A plurality of screws insert throughout the pinholes 910 of the standoffs 90 for mounting the LGA connector 100 to the PCB.

In operation, the actuator 704 of the lever 70 is rotated upwardly to an open position due to an external force exerted on the handle 708. The depressing portion 610 of the cover 60 is released by the bending portion 706 and the cover 60 is rotated to the open position. The IC package is mounted on the supporting wall 305 of the housing 30 and would be electrically connected to the PCB via the contacts. The cover 60 is rotated to a horizontal closed position, with the side walls 608 thereof resisting against the blocking portions 506 of the stiffener 50. The actuator 704 is driven to the horizontal closed position by the handle 708 and the bending portion 706 depresses the depressing portion 610 into the depression 513. The actuator 704 engages with latch 507 to keep itself together with the cover 60 in the horizontal closed position.

The conventional mounting hole is designed circular. Thus, only the screws whose screw cap has the diameter longer than the diameter of the conventional circular mounting hole could be used. The mounting hole 502 in this application is designed to reduce a distance between a certain part of opposite edges of conventional mounting hole. The mounting hole 502 in this application thereby has a long diameter equal to that of the conventional mounting hole, and a short diameter shorter than the long diameter. Therefore, the screws whose screw cap has the diameter larger than the short diameter could be applied in this application. More type of screws could be used.

However, the disclosure is illustrative only, changes may be made in detail, especially in matter of shape, size, and arrangement of parts within the principles of the invention. For example, in this embodiment in a top view there are two teeth and two regions of the stiffener, i.e., two plus two, alternately arranged around the mounting hole so as to form a capsular configuration thereof. Understandably, arrangement of four plus four or six plus six or even more may be used in the instant invention.

What is claimed is:

1. A land grid array connector adapted for being mounted to a printed circuit board, comprising:
    a housing defining a plurality of slots;
    a plurality of contacts mounted in slots of the housing;
    a stiffener coupled with the housing and defining a first window in a central portion thereof for receiving the housing and a plurality of non-circular mounting holes at corner portions thereof, each mounting hole having a long diameter and a short diameter;
    a cover pivotably mounted at a rear portion of the stiffener;
    a lever pivotably mounted at a front portion of the stiffener; and
    a plurality of standoffs inserted into the mounting holes of the stiffener, each standoff defining a pinhole through which a screw comprising a screw cap having a diameter larger than the short diameter of the mounting hole is insertable.

2. The land grid array connector as claimed in claim 1, wherein said mounting hole is shaped by interconnecting a pair of symmetrical arc-like edges and a pair of opposite parallel edges.

3. The land grid array connector as claimed in claim 1, wherein said mounting hole is shaped into ellipse.

4. The land grid array connector as claimed in claim 1, wherein each standoff comprises a base portion defining the pinhole, a plurality of teeth extending upwardly from the base portion, and a pair of symmetrical indentations respectively defined between two adjacent teem for coupling the mounting hole.

5. The land grid array connector as claimed in claim 1, wherein said lever comprises a shaft, said stiffener comprises a pair of supporting portions upholding the shaft and a pair of engaging portions engaging with the shaft.

6. The land grid array connector as claimed in claim 5, wherein said cover has a depressing portion, said shaft of the lever has a bending portion depressing the depressing portion at the horizontal closed position.

7. The land grid array connector as claimed in claim 5, wherein said lever comprises an actuator perpendicular to the shaft and coupling with a latch formed on the stiffener.

8. The land grid array connector as claimed in claim 5, further comprising a ring assembled to a free end of the shaft and resisting against one supporting portion.

9. An electrical connector for mounting on a printed circuit board, comprising:
    an insulative housing for mounting on said printed circuit board, having a plurality of contacts therein;
    a metallic stiffener for mounting on said printed circuit board, protectively surrounding the housing and defining at least one mounting hole extending therethrough in a vertical direction; and
    a standoff upwardly mounted to an underside of the stiffener, said standoff including a base portion which defines a vertical thickness for compliance wit a gap between the stiffener and the printed circuit board, a pin hole for receiving a screw, and at least one tooth, with a radial thickness, extending upwardly from the base, under a condition of being intimately not only received in the mounting bole but also surrounding the pin hole with an incomplete circumferential manner; wherein said pin hole is essentially circular while the mounting hole is essentially not circular under a condition that said mounting hole defines at least two larger and smaller type diameters of which, the large type is essentially equal to a sum of a diameter of said pin hole and said thickness of said tooth, while the short type is essentially equal to the diameter of said pin hole only, so that said screw for use with said pin hole no longer requires a screw cap having a diameter larger than said larger diameter but further allows another diameter ranged between the larger diameter and the smaller diameter.

10. The electrical connector as claimed in claim 9, wherein said mounting hole is capsular.

11. The electrical connector as claimed in claim 9, wherein there are two of said tooth spaced from each other and symmetrically arranged around the pin hole and received in the mounting hole.

12. The electrical connector as claimed in claim 9, wherein the tooth extends upwardly from the base with a height essentially equal to a vertical thickness of the mounting hole.

* * * * *